(12) United States Patent
Wagoner et al.

(10) Patent No.: US 10,742,110 B1
(45) Date of Patent: Aug. 11, 2020

(54) SYSTEM AND METHOD FOR OPERATING A POWER CONVERTER TO IMPROVE IGBT RELIABILITY

(71) Applicant: General Electric Company, Schenectady, NY (US)

(72) Inventors: Robert Gregory Wagoner, Roanoke, VA (US); Anthony William Galbraith, Wirtz, VA (US); David Smith, Daleville, VA (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 16/449,808

(22) Filed: Jun. 24, 2019

(51) Int. Cl.
*H02M 1/32* (2007.01)
*H03K 17/14* (2006.01)
*H02H 7/12* (2006.01)
*H02M 5/45* (2006.01)

(52) U.S. Cl.
CPC ............ *H02M 1/32* (2013.01); *H02H 7/1216* (2013.01); *H02M 5/45* (2013.01); *H03K 17/14* (2013.01)

(58) Field of Classification Search
CPC .......... H03K 17/14; H02M 1/32; H02M 5/45; H02H 7/1216
See application file for complete search history.

(56) References Cited

U.S. PATENT DOCUMENTS

2012/0192921 A1* 8/2012 Tiittanen ........... H01L 31/02021
136/248
2019/0097519 A1* 3/2019 Yamakawa ........... H02M 1/088

* cited by examiner

*Primary Examiner* — Kyle J Moody
(74) *Attorney, Agent, or Firm* — Dority & Manning, P.A.

(57) ABSTRACT

A method for operating a renewable energy power system driven by at least one renewable energy power source and having at least one current conversion device includes determining a temperature of power semiconductor device(s) of the current conversion device(s). The method also includes determining whether an amount of power of the renewable energy power source(s) is above a predetermined threshold. Further, the method includes increasing or maintaining the temperature of the power semiconductor device(s) during periods of time when the amount of the renewable energy power source(s) is below the predetermined threshold.

20 Claims, 6 Drawing Sheets

SYSTEM AND METHOD FOR OPERATING A POWER CONVERTER TO IMPROVE IGBT RELIABILITY

FIELD

The present disclosure relates generally to power converters and, more particularly, to a system and method for operating a power converter to improve insulated-gate bipolar transistor (IGBT) reliability.

BACKGROUND

Wind power is considered one of the cleanest, most environmentally friendly energy sources presently available, and wind turbines have gained increased attention in this regard. A modern wind turbine typically includes a tower, generator, gearbox, nacelle, and one or more rotor blades. The rotor blades capture kinetic energy of wind using known airfoil principles. For example, rotor blades typically have the cross-sectional profile of an airfoil such that, during operation, air flows over the blade producing a pressure difference between the sides. Consequently, a lift force, which is directed from a pressure side towards a suction side, acts on the blade. The lift force generates torque on the main rotor shaft, which is geared to a generator for producing electricity.

During operation, wind impacts the rotor blades of the wind turbine and the blades transform wind energy into a mechanical rotational torque that rotatably drives a low-speed shaft. The low-speed shaft is configured to drive the gearbox that subsequently steps up the low rotational speed of the low-speed shaft to drive a high-speed shaft at an increased rotational speed. The high-speed shaft is generally rotatably coupled to a generator so as to rotatably drive a generator rotor. As such, a rotating magnetic field may be induced by the generator rotor and a voltage may be induced within a generator stator that is magnetically coupled to the generator rotor. In certain configurations, the associated electrical power can be transmitted to a turbine transformer that is typically connected to a power grid via a grid breaker. Thus, the turbine transformer steps up the voltage amplitude of the electrical power such that the transformed electrical power may be further transmitted to the power grid.

In many wind turbines, the generator rotor may be electrically coupled to a bi-directional power converter that includes a rotor side converter joined to a line side converter via a regulated DC link. More specifically, some wind turbines, such as wind-driven doubly-fed induction generator (DFIG) systems or full power conversion systems, may include a power converter with an AC-DC-AC topology. In such system, the generator stator is separately connected to the power grid via a main transformer.

The power converter usually includes several switching devices such as insulated gate bipolar transistors (IGBTs), integrated gate commutated thyristors (IGCTs or GCTs), diodes, and/or metal oxide semiconductor field effect transistors (MOSFETs) that are switched at certain frequencies to generate the desired converter output voltage and frequency. The converter output voltage is then provided to various loads such as motors, power grids, resistive loads, etc.

IGBTs and other power semiconductors have a failure mode based on cosmic rays. High-energy particles from outer space travel into the earth's atmosphere and collide with an atomic nucleus in the outer atmosphere, thereby creating a multitude of secondary particles which carry away the energy of the primary particle. These particles can randomly hit the IGBTs and other power semiconductors with a probability based on the size of the device as well as altitude. If the IGBT is supporting voltage when hit by one of these particles (hence the semiconductor junction is acting in the blocking region), the particle(s) can create electron-hole pairs which carry current in very small portions of the IGBT. Depending on the voltage across the IGBT and the energy level of the particle(s), the IGBT may be permanently damaged.

Thus, the present disclosure is directed to systems and methods for operating a power converter to improve IGBT reliability by addressing the aforementioned issues.

BRIEF DESCRIPTION

Aspects and advantages of the invention will be set forth in part in the following description, or may be obvious from the description, or may be learned through practice of the invention.

In one aspect, the present disclosure is directed to a method for operating a renewable energy power system driven by at least one renewable energy power source. The renewable energy power system has at least one current conversion device. The method includes determining a temperature of power semiconductor device(s) of the current conversion device(s). The method also includes determining whether an amount of power of the renewable energy power source(s) is above a predetermined threshold. Further, the method includes increasing or maintaining the temperature of the power semiconductor device(s) during periods of time when the amount of the renewable energy power source(s) is below the predetermined threshold.

In an embodiment, the current conversion device(s) may be a power converter or a power inverter. In another embodiment, the renewable energy power system may be a wind turbine power system, a solar power system, or an energy storage power system. Thus, the renewable energy power source(s) may be wind, sun, or stored energy.

In further embodiments, increasing or maintaining the temperature of the at least one power semiconductor device during periods of time when the amount of the at least one renewable energy power source is below the predetermined threshold may include increasing a coolant temperature of the at least one power semiconductor device to an increased coolant temperature. In such embodiments, increasing the coolant temperature of the power semiconductor device(s) to the increased coolant temperature may include thermostatically controlling the coolant temperature via a mechanical thermostat system. In alternative embodiments, increasing the coolant temperature of the power semiconductor device (s) to the increased coolant temperature may include electrically adjusting a fan speed of a cooling fan of the power semiconductor device(s).

In an embodiment, the power semiconductor device(s) includes an insulated-gate bipolar transistor (IGBT), an integrated gate commutated thyristor (IGCT), a gate commutated thyristor (GCT), a diode, and/or a metal oxide semiconductor field effect transistor (MOSFET).

As such, in one embodiment, the method may include reducing or stopping switching of the power semiconductor device(s) as the temperature of the power semiconductor device(s) increases.

In additional embodiments, increasing or maintaining the temperature of the power semiconductor device(s) during periods of time when the amount of the renewable energy power source(s) is below the predetermined threshold may include operating the power semiconductor device(s) at a minimal current such that only switching power loss provides heat to the power semiconductor device(s).

In an embodiment, increasing or maintaining the temperature of the power semiconductor device(s) during periods of time when the amount of the renewable energy power source(s) is below the predetermined threshold may include increasing a switching frequency of the power semiconductor device(s) to increase the switching power loss.

In several embodiments, increasing or maintaining the temperature of the power semiconductor device(s) during periods of time when the amount of the renewable energy power source(s) is below the predetermined threshold may include circulating reactive power through a line filter of the current conversion device(s) so as to maintain switching of the power semiconductor device(s).

In another aspect, the present disclosure is directed to a renewable energy power system driven by at least one renewable energy power source. The renewable energy power system includes at least one current conversion device having at least one power semiconductor device, one or more sensors for determining a temperature of the power semiconductor device(s), and a controller communicatively coupled to the sensor(s). The controller is configured for performing a plurality of operations, including but not limited to determining whether the renewable energy power source(s) is above a predetermined threshold and increasing or maintaining the temperature of the power semiconductor device(s) during periods of time when the amount of the renewable energy power source(s) is below the predetermined threshold.

It should be understood that the renewable energy power system may further include any combination of the additional features as described herein.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

DETAILED DESCRIPTION

Figure 1:
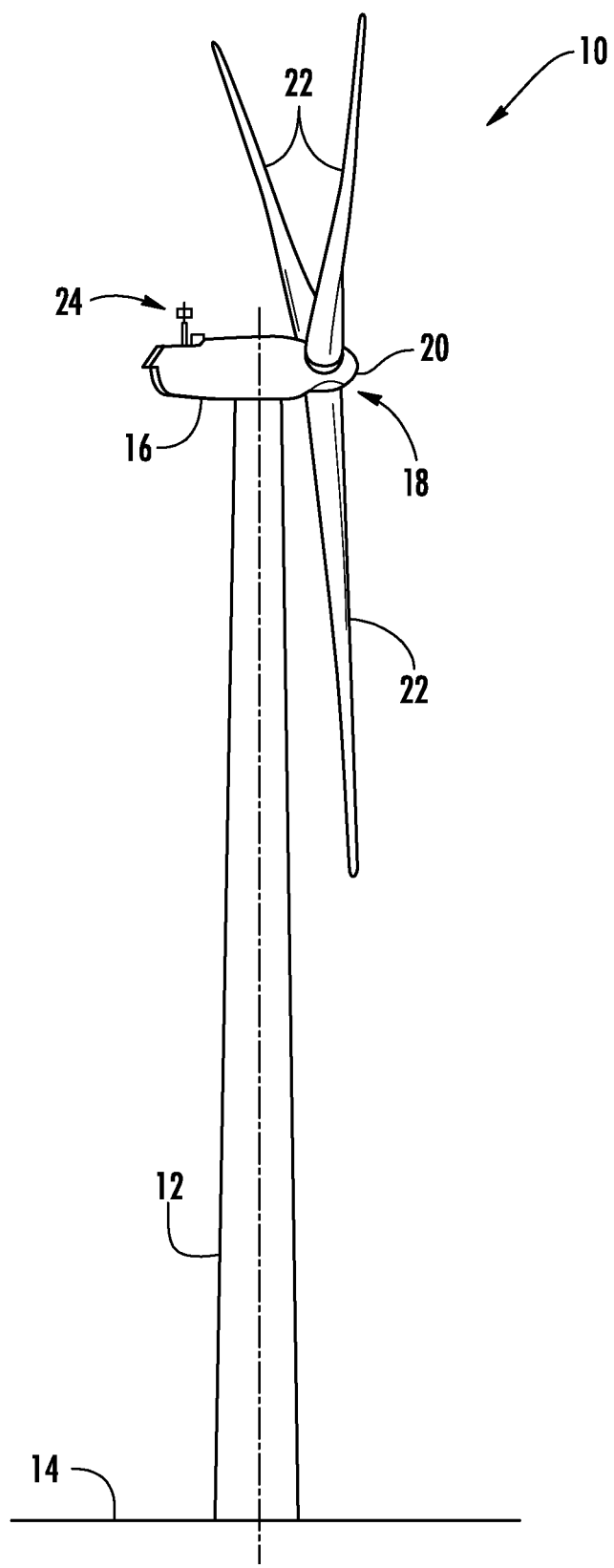
FIG. 1 illustrates a perspective view of an embodiment of a wind turbine according to the present disclosure.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope of the invention. For instance, features illustrated or described as part of one embodiment can be used with another embodiment to yield a still further embodiment. Thus, it is intended that the present invention covers such modifications and variations as come within the scope of the appended claims and their equivalents.

In general, the present disclosure is directed to systems and methods for operating a renewable energy power system driven by a renewable energy power source so as to improve reliability of IGBT modules. The renewable energy power system may be a wind turbine power system, a solar power system, or an energy storage power system. Thus, the renewable energy power source(s) may be wind, sun, or stored energy. More specifically, in an embodiment, the renewable energy power system includes at least one current conversion device (such as a power converter or power inverter) that has a plurality of switches. Thus, one or more sensors monitor a temperature of the power semiconductor device(s). A controller can then determine whether the renewable energy power source(s) is available. If the renewable energy power source(s) is unavailable (such as in instances of low wind or at night), the controller can increase the temperature of the power semiconductor device(s), e.g. during periods of time when the power semiconductor device(s) would normally cool down to ambient temperature.

By operating the switches in the manner instead of shutting them down, the switches are prevented from cooling down as much. Accordingly, such power semiconductors are less likely to fail from cosmic ray particles when the semiconductor junction temperature is higher.

Referring now to the drawings, FIG. 1 illustrates a perspective view of one embodiment of a wind turbine 10. As shown, the wind turbine 10 generally includes a tower 12 extending from a support surface 14, a nacelle 16 mounted on the tower 12, and a rotor 18 coupled to the nacelle 16. The rotor 18 includes a rotatable hub 20 and at least one rotor blade 22 coupled to and extending outwardly from the hub 20. For example, in the illustrated embodiment, the rotor 18 includes three rotor blades 22. However, in an alternative embodiment, the rotor 18 may include more or less than three rotor blades 22. Each rotor blade 22 may be spaced about the hub 20 to facilitate rotating the rotor 18 to enable kinetic energy to be transferred from the wind into usable mechanical energy, and subsequently, electrical energy. For instance, as will be described below, the rotor 18 may be rotatably coupled to an electric generator 120 (FIG. 2) for production of electrical energy. One or more wind conditions, such as wind speed and/or wind direction may also be monitored via a wind sensor 24, such as an anemometer, located on the nacelle 16 or any other suitable location near the wind turbine 10.

Figure 2:
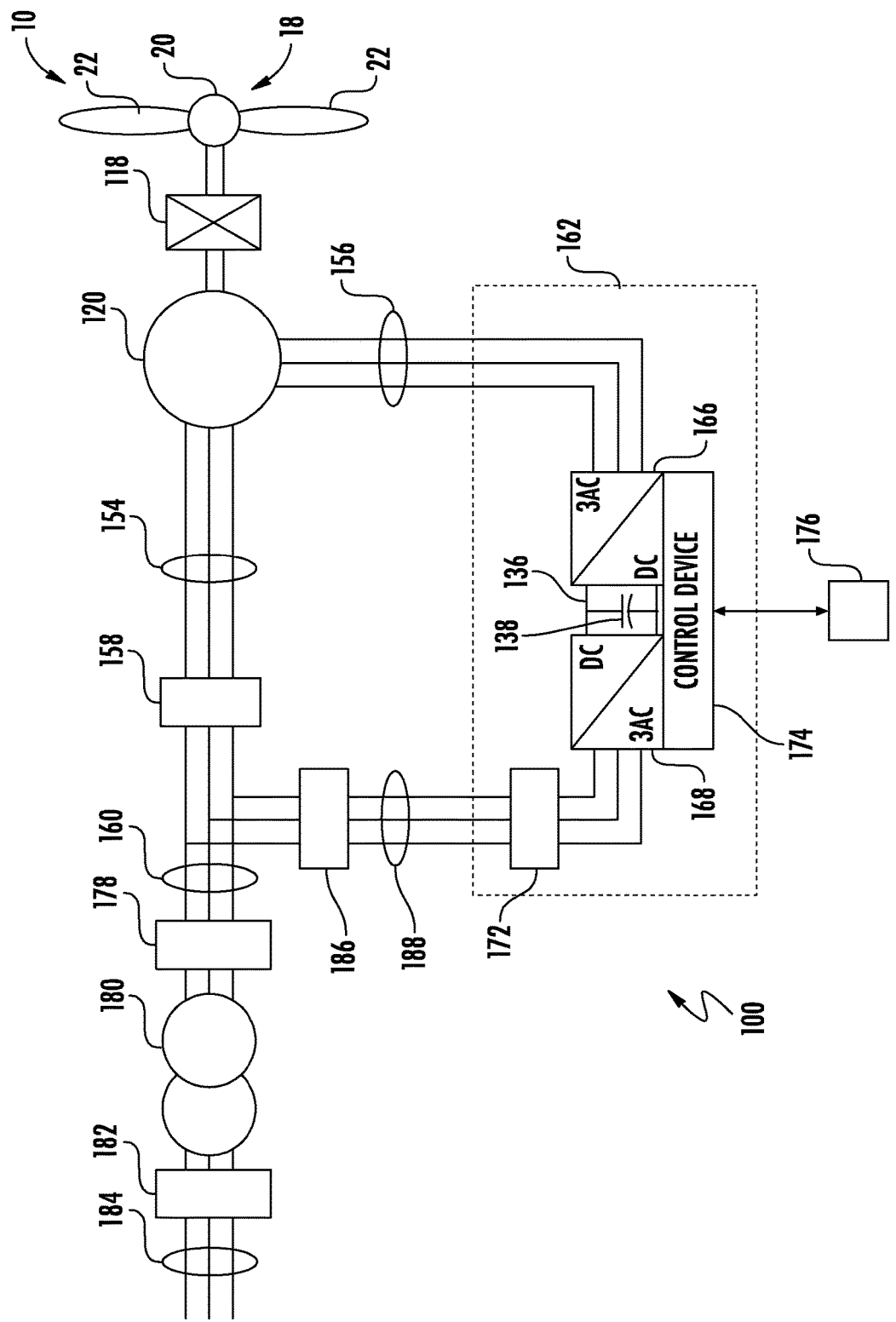
FIG. 2 illustrates a schematic view of one embodiment of a wind turbine electrical power system suitable for use with the wind turbine shown in FIG. 1.

Referring now to FIG. 2, a schematic diagram of one embodiment of a wind turbine DFIG power system 100 ("wind turbine system") is illustrated in accordance with aspects of the present disclosure. Although the present disclosure will generally be described herein with reference to the system 100 shown in FIG. 2, those of ordinary skill in the art, using the disclosures provided herein, should understand that aspects of the present disclosure may also be applicable in other power generation systems, and, as mentioned above, that the invention is not limited to wind turbine systems.

In the embodiment of FIG. 2, the rotor 18 of the wind turbine 10 (FIG. 1) may, optionally, be coupled to a gearbox 118, which is, in turn, coupled to the generator 120, which may be a doubly fed induction generator (DFIG). As shown, the DFIG 120 may be connected to a stator bus 154. Further, as shown, the wind turbine power system 100 may include at least one current conversion device(s) 175, such as a power converter (for wind applications) or a power inverter (e.g. for solar applications). More specifically, as shown, the current conversion device 175 is a power converter 162 connected to the DFIG 120 via a rotor bus 156, and to the stator bus 154 via a line side bus 188.

As such, the stator bus 154 may provide an output multiphase power (e.g. three-phase power) from a stator of the DFIG 120, and the rotor bus 156 may provide an output multiphase power (e.g. three-phase power) from a rotor of the DFIG 120. The power converter 162 may also include a rotor side converter (RSC) 166 and a line side converter (LSC) 168. The DFIG 120 is coupled via the rotor bus 156 to the rotor side converter 166. Additionally, the RSC 166 is coupled to the LSC 168 via a DC link 136 across which is a DC link capacitor 138. The LSC 168 is, in turn, coupled to a line side bus 188.

The RSC 166 and the LSC 168 may be configured for normal operating mode in a three-phase, pulse width modulation (PWM) arrangement using insulated gate bipolar transistor (IGBT) switching elements, as will be discussed in more detail with respect to FIG. 3.

In addition, the power converter 162 may be coupled to a controller 174 in order to control the operation of the rotor side converter 166 and the line side converter 168. It should be noted that the converter controller 174 may be configured as an interface between the power converter 162 and a local wind turbine control system 176 and may include any number of control devices. In one embodiment, the controller 174 may include a processing device (e.g. microprocessor, microcontroller, etc.) executing computer-readable instructions stored in a computer-readable medium. The instructions when executed by the processing device may cause the processing device to perform operations, including providing control commands (e.g. switching frequency commands) to the power semiconductor devices of the power converter 162.

In typical configurations, various line contactors and circuit breakers including, for example, a grid breaker 182 may also be included for isolating the various components as necessary for normal operation of the DFIG 120 during connection to and disconnection from a load, such as the electrical grid 184. For example, a system circuit breaker 178 may couple the system bus 160 to a transformer 180, which may be coupled to the electrical grid 184 via the grid breaker 182. In alternative embodiments, fuses may replace some or all of the circuit breakers.

In operation, alternating current power generated at the DFIG 120 by rotating the rotor 18 is provided to the electrical grid 184 via dual paths defined by the stator bus 154 and the rotor bus 156. On the rotor bus side 156, sinusoidal multi-phase (e.g. three-phase) alternating current (AC) power is provided to the power converter 162. The rotor side power converter 166 converts the AC power provided from the rotor bus 156 into direct current (DC) power and provides the DC power to the DC link 136. As is generally understood, power semiconductor devices (e.g. IGBTs) used in the bridge circuits of the rotor side power converter 166 may be modulated to convert the AC power provided from the rotor bus 156 into DC power suitable for the DC link 136.

In addition, the LSC 168 converts the DC power on the DC link 136 into AC output power suitable for the electrical grid 184. In particular, power semiconductor devices (e.g. IGBTs) used in bridge circuits of the LSC 168 can be modulated to convert the DC power on the DC link 136 into AC power on the line side bus 188. The AC power from the power converter 162 can be combined with the power from the stator of DFIG 120 to provide multi-phase power (e.g. three-phase power) having a frequency maintained substantially at the frequency of the electrical grid 184 (e.g. 50 Hz or 60 Hz). In certain instances, as mentioned, for an individual DFIG wind turbine power system 100, the reactive power may be supplied primarily by the RSC 166, via the generator 120 and the LSC 168.

Additionally, various circuit breakers and switches, such as grid breaker 182, system breaker 178, stator sync switch 158, converter breaker 186, and line contactor 172 may be included in the wind turbine power system 100 to connect or disconnect corresponding buses, for example, when current flow is excessive and may damage components of the wind turbine power system 100 or for other operational considerations. Additional protection components may also be included in the wind turbine power system 100.

Moreover, the power converter 162 may receive control signals from, for instance, the local control system 176 (also referred to herein as a turbine controller) via the converter controller 174. The control signals may be based, among other things, on sensed states or operating characteristics of the wind turbine power system 100. Typically, the control signals provide for control of the operation of the power converter 162. For example, feedback in the form of a sensed speed of the DFIG 120 may be used to control the conversion of the output power from the rotor bus 156 to maintain a proper and balanced multi-phase (e.g. three-phase) power supply. Other feedback from other sensors may also be used by the controller 174 or control system 176 to control the power converter 162, including, for example, stator and rotor bus voltages and current feedbacks. Using the various forms of feedback information, switching control signals (e.g. gate timing commands for IGBTs), stator synchronizing control signals, and circuit breaker signals may be generated.

The power converter 162 also compensates or adjusts the frequency of the three-phase power from the rotor for changes, for example, in the wind speed at the hub 20 and the blades 22. Therefore, mechanical and electrical rotor frequencies are decoupled and the electrical stator and rotor frequency matching is facilitated substantially independently of the mechanical rotor speed.

Under some states, the bi-directional characteristics of the power converter 162, and specifically, the bi-directional characteristics of the LSC 168 and RSC 166, facilitate feeding back at least some of the generated electrical power into generator rotor 120. More specifically, electrical power may be transmitted from the stator bus 154 to the line side bus 188 and subsequently through the line contactor 172 and into the power converter 162, specifically the LSC 168 which acts as a rectifier and rectifies the sinusoidal, three-phase AC power to DC power. The DC power is transmitted into the DC link 136. The capacitor 138 facilitates mitigating DC link voltage amplitude variations by facilitating mitigation of a DC ripple sometimes associated with three-phase AC rectification.

The DC power is subsequently transmitted to the RSC 166 that converts the DC electrical power to a three-phase, sinusoidal AC electrical power by adjusting voltages, currents, and frequencies. This conversion is monitored and controlled via the converter controller 174. The converted AC power is transmitted from the RSC 166 via the rotor bus 156 to the generator rotor. In this manner, generator reactive power control is facilitated by controlling rotor current and voltage.

Figure 3:
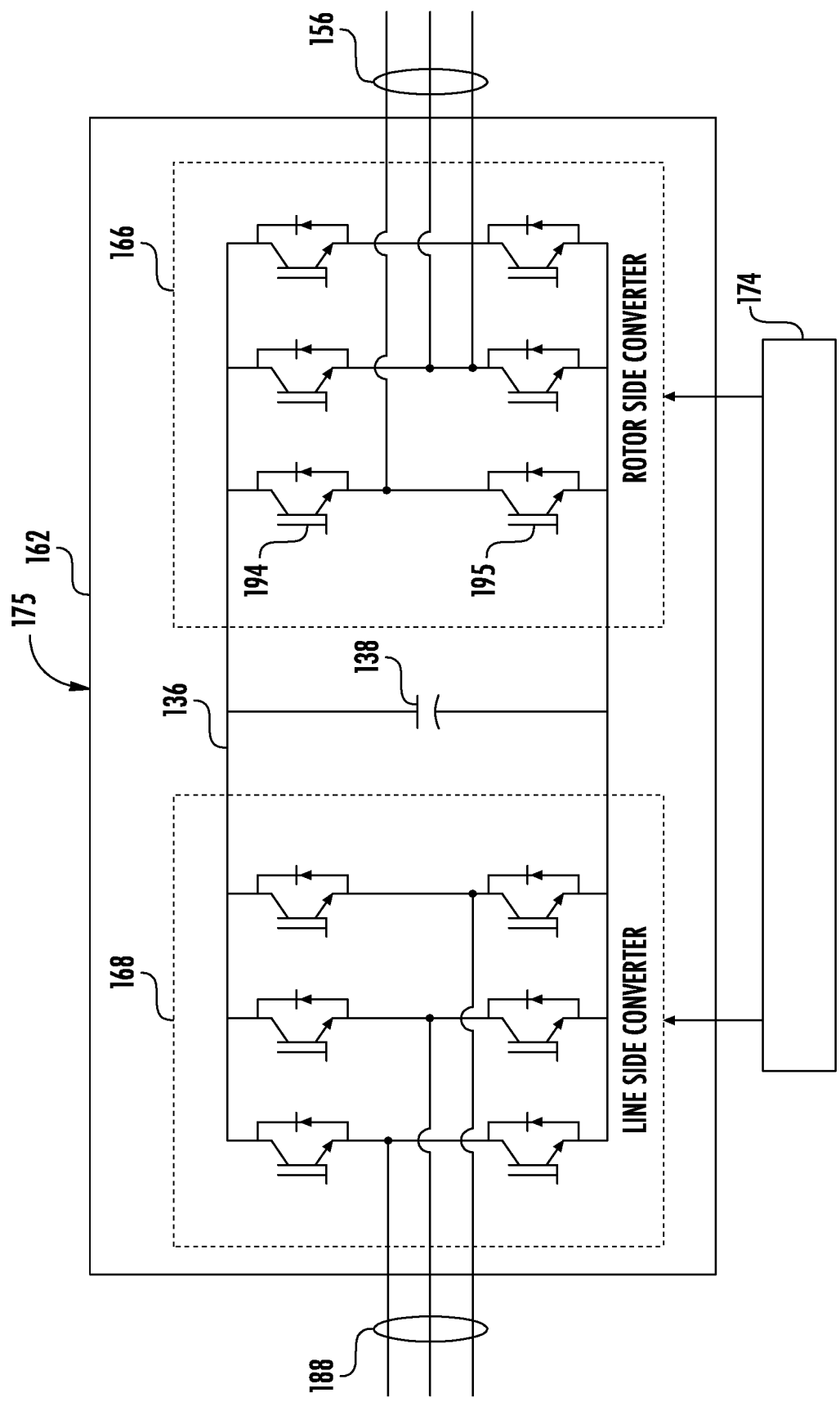
FIG. 3 illustrates a schematic diagram of one embodiment of a power converter of a wind turbine according to the present disclosure.

Referring now to FIG. 3, a detailed, schematic diagram of one embodiment of the power converter 162 shown in FIG. 2 is illustrated in accordance with aspects of the present disclosure. As shown, the RSC 166 includes a plurality of bridge circuits (e.g. H-bridge circuits), with each phase of the rotor bus 156 input to the rotor side converter 166 being coupled to a single bridge circuit. In addition, the LSC 168 may also include a plurality of bridge circuits. Similar to the rotor side converter 166, the line side converter 168 also includes a single bridge circuit for each output phase of the line side converter 168. In other embodiments, the line side converter 168, the rotor side converter 166, or both the line side converter 168 and the rotor side converter 166 may include parallel bridge circuits without deviating from the scope of the present disclosure.

Each bridge circuit may generally include a plurality of power semiconductor devices 194, 195 (e.g. IGBTs, IGCTs, GCTs, diodes, and/or MOSFETs) coupled in series with one another. For instance, as shown in FIG. 3, each bridge circuit includes at least one upper IGBT (e.g. IGBT 194) and at least one lower IGBT (e.g. IGBT 195). In addition, a diode may be coupled in parallel with each of the IGBTs. In alternative embodiments, parallel IGBTs and diodes may be used to increase the current rating of the converter.

Figure 4:
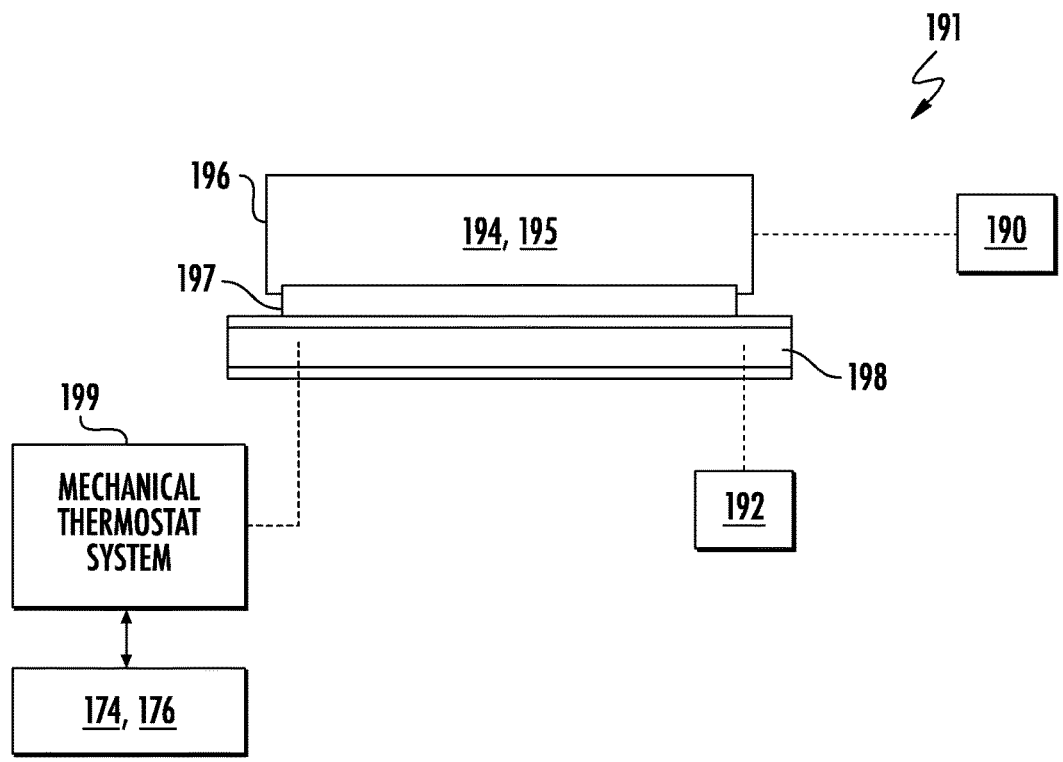
FIG. 4 illustrates a schematic view of one embodiment of an IGBT module according to the present disclosure.
Figure 5:
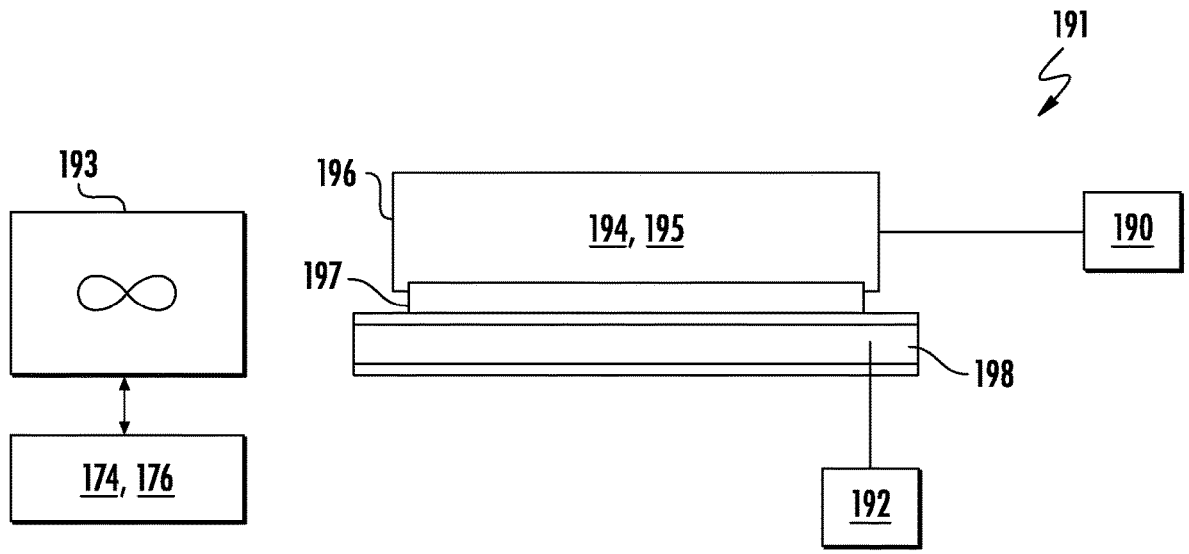
FIG. 5 illustrates a schematic view of another embodiment of an IGBT module according to the present disclosure.

As is generally understood, power semiconductor devices can experience power loss during switching, therefore, it is imperative to keep them cool during operation. Thus, as shown in FIGS. 4-5, schematic views of various embodiments of an IGBT module 191 according to the present disclosure are illustrated. As shown, each of the illustrated IGBT modules 191 includes a housing 196 for containing the IGBTs 194, 195. The housing 196 may be secured to a base 197 that has a coolant 198 circulated therethrough for cooling the various power semiconductor devices housed therein. It should be understood that the present disclosure also includes other embodiments and configurations of IGBT modules 191 and is not limited to the example embodiments illustrated in FIGS. 4-5.

As is generally understood, the line side converter 168 and the rotor side converter 166 may be controlled, for instance, by providing control commands, using a suitable driver circuit, to the gates of the IGBTs. For example, the converter controller 174 may provide suitable gate timing commands to the gates of the IGBTs of the bridge circuits. The control commands may control the switching frequency of the IGBTs to provide a desired output. It should be appreciated by those of ordinary skill in the art that, as an alternative to IGBTs, the power convertor 162 may include any other suitable power semiconductor devices, such as, IGCTs, GCTs, diodes, and/or MOSFETs.

Figure 6:
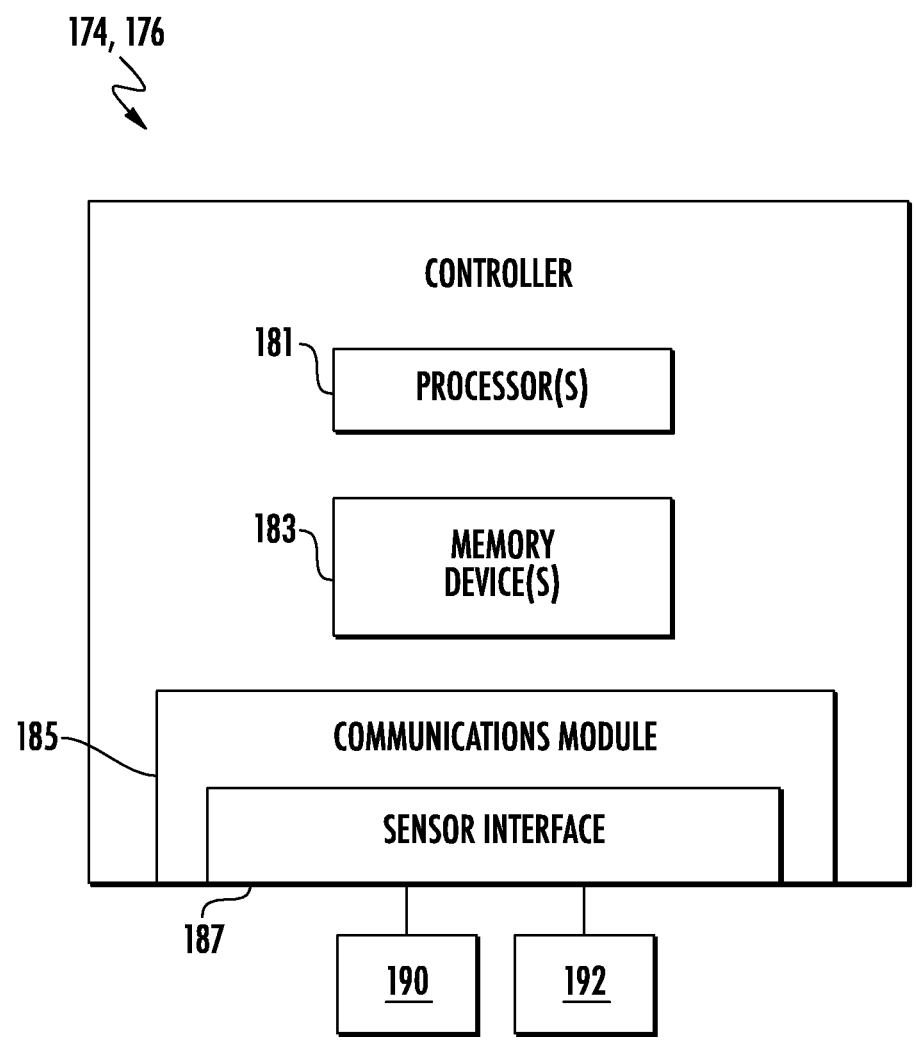
FIG. 6 illustrates a schematic view of one embodiment of a controller according to the present disclosure.

It should be appreciated that the converter controller 174 and turbine controller 176 may each correspond to any suitable computing device and/or any combination of computing devices. For instance, as shown in FIG. 6, the controller(s) 174, 176 may one or more processor(s) 181 and associated memory device(s) 183 configured to perform a variety of computer-implemented functions and/or instructions (e.g., performing the methods, steps, calculations and the like and storing relevant data as disclosed herein). The instructions when executed by the processor(s) 181 can cause the processor(s) 181 to perform operations, including providing control commands (e.g. pulse width modulation commands) to the power semiconductor devices of the power converter 162 and other aspects of the power system 100.

Additionally, the controller(s) 174, 176 may also include a communications module 185 to facilitate communications between the controller(s) 174, 176 and the various components of the power system 100, e.g. any of the components of FIGS. 1-5. Further, the communications module 185 may include a sensor interface 187 (e.g., one or more analog-to-digital converters) to permit signals transmitted from one or more sensors to be converted into signals that can be understood and processed by the processor(s) 181. It should be appreciated that the sensors (e.g. sensors 190, 192) may be communicatively coupled to the communications module 185 using any suitable means. For example, as shown in FIG. 6, the sensors 190, 192 are coupled to the sensor interface 187 via a wired connection. However, in other embodiments, the sensors 190, 192 may be coupled to the sensor interface 187 via a wireless connection, such as by using any suitable wireless communications protocol known in the art. As such, the processor(s) 181 may be configured to receive one or more signals from the sensors 190, 192.

As used herein, the term "processor" refers not only to integrated circuits referred to in the art as being included in a computer, but also refers to a controller, a microcontroller, a microcomputer, a programmable logic controller (PLC), an application specific integrated circuit, and other programmable circuits. The processor(s) 181 is also configured to compute advanced control algorithms and communicate to a variety of Ethernet or serial-based protocols (Modbus, OPC, CAN, etc.).

Additionally, the memory device(s) 183 may generally comprise memory element(s) including, but not limited to, computer readable medium (e.g., random access memory (RAM)), computer readable non-volatile medium (e.g., a flash memory), a floppy disk, a compact disc-read only memory (CD-ROM), a magneto-optical disk (MOD), a digital versatile disc (DVD) and/or other suitable memory elements. Such memory device(s) 183 may generally be configured to store suitable computer-readable instructions that, when implemented by the processor(s) 181, configure the controller(s) 174, 176 to perform the various functions as described herein.

Figure 7:
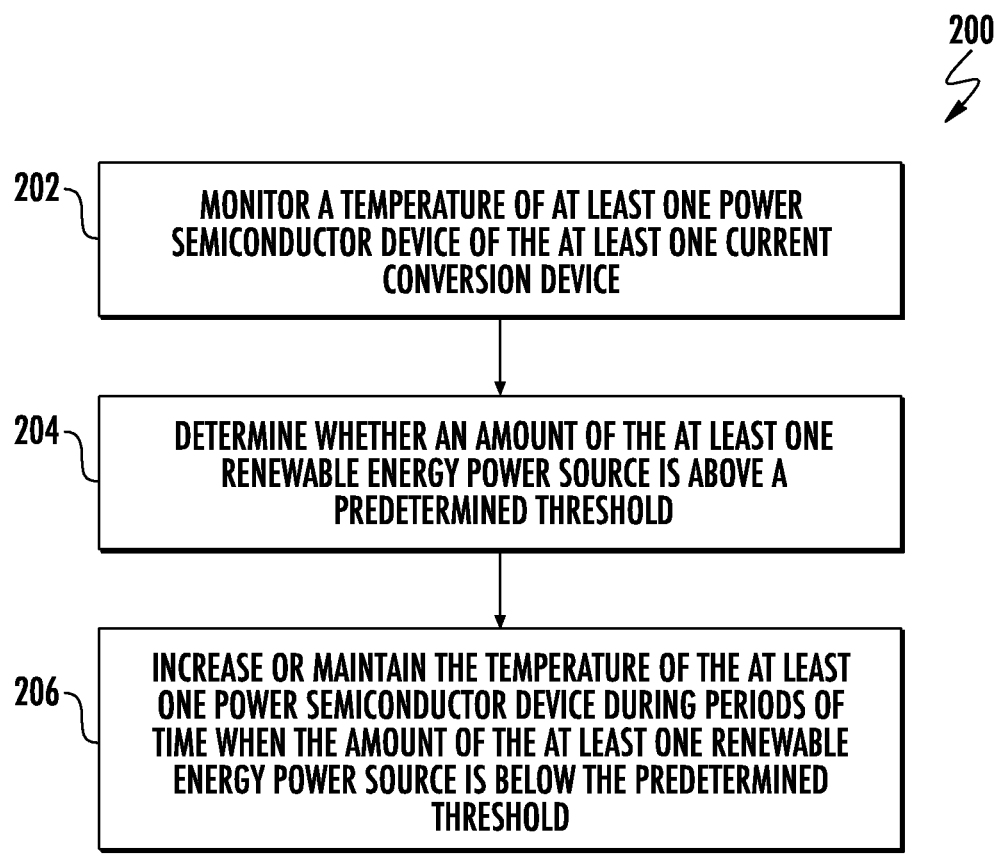
FIG. 7 illustrates a flow diagram of one embodiment of a method for operating a renewable energy power system driven by at least one renewable energy power source according to the present disclosure.

Referring now to FIG. 7, a flow diagram of an embodiment of a method 200 for operating a renewable energy power system driven by at least one renewable energy power source is illustrated in accordance with aspects of the present disclosure. Further, as mentioned, the renewable energy power system has at least one current conversion device (e.g. the power converter 162). In general, the method 200 is described herein as implemented using, for example, the wind turbine power system 100 described above. However, it should be appreciated that the disclosed method 200 may be implemented using any other suitable renewable energy power system that is driven by a renewable energy power source, such as wind, solar, and/or stored energy. In addition, although FIG. 7 depicts steps performed in a particular order for purposes of illustration and discussion, the methods described herein are not limited to any particular order or arrangement. One skilled in the art, using the disclosures provided herein, will appreciate that various steps of the methods can be omitted, rearranged, combined and/or adapted in various ways.

As shown at (202), the method 200 includes determining a temperature of power semiconductor device(s) 194, 195 of the current conversion device(s) 175. For example, in one embodiment, the sensors 190, 192 may monitor the temperature of the power semiconductor device(s) 194, 195. Particularly, in an embodiment, as shown in FIG. 4, the sensor 190 may directly monitor the temperature of the power semiconductor device(s) 194, 195. Alternatively, as show, the sensor 192 may monitor the power semiconductor device(s) 194, 195 indirectly, such as by monitoring via the coolant of the power semiconductor device(s) 194, 195.

Referring back to FIG. 7, as shown at (204), the method 200 includes determining whether an amount of power of the renewable energy power source(s) is above a predetermined threshold. For example, as mentioned, the renewable energy power source(s) may be wind, solar, or stored energy, depending on the type of power system being utilized. Thus, in instances of wind applications, the predetermined threshold may correspond to cut-in wind speed. In instances of solar applications, the predetermined threshold may be determined based on time of day. Therefore, the controller(s) 174, 176 may determine that the solar power is above the predetermined threshold during the day or not above the predetermined threshold at night. The controller(s) 174, 176 may also be configured to consider cloud coverage and/or the presence of a storm that may have an impact on the solar power. In instances of energy storage applications, the predetermined threshold may be set based on an amounted of stored energy that is required to generate real and/or reactive power.

As shown at (206), the method 200 includes increasing or maintaining the temperature of the power semiconductor device(s) 194, 195 during periods of time when the amount of the renewable energy power source(s) is below the predetermined threshold. For example, in one embodiment, the controller(s) 174, 176 may be configured to increase or maintain the temperature of the power semiconductor device (s) 194, 195 by increasing a coolant temperature of the power semiconductor device(s) 194, 195 to an increased coolant temperature. In such embodiments, as shown in FIG. 4, the controller(s) 174, 176 may increase the coolant temperature of the power semiconductor device(s) 194, 195 to the increased coolant temperature by thermostatically controlling the coolant temperature via a mechanical thermostat system 199. For example, in one embodiment, the mechanical thermostat system 199 may have one or more chillers and/or heat exchangers in fluid communication with the coolant 198.

In alternative embodiments, as shown in FIG. 5, the controller(s) 174, 176 may increase the coolant temperature of the power semiconductor device(s) 194, 195 to the increased coolant temperature by electrically adjusting a fan speed of a cooling fan 193 of the power semiconductor device(s) 194, 195.

In additional embodiments, the controller(s) 174, 176 may increase or maintain the temperature of the power semiconductor device(s) 194, 195 by operating the power semiconductor device(s) 194, 195 at a minimal current such that only switching power loss provides heat to the power semiconductor device(s) 194, 195. Thus, in one embodiment, the controller(s) 174, 176 may increase or maintain the temperature of the power semiconductor device(s) 194, 195 by increasing a switching frequency of the power semiconductor device(s) 194, 195 to increase the switching power loss.

In another embodiment, the controller(s) 174, 176 may increase or maintain the temperature of the power semiconductor device(s) 194, 195 by circulating reactive power through the AC line filter of the current conversion device(s) 175 so as to maintain switching of the power semiconductor device(s) 194, 195.

In yet another embodiment, the method 200 may include reducing or stopping switching of the IGBTs 194, 195 as the temperature of the IGBT increases.

Various aspects and embodiments of the present invention are defined by the following numbered clauses:

Clause 1. A method for operating a renewable energy power system driven by at least one renewable energy power source, the renewable energy power system having at least one current conversion device, the method comprising:
  determining a temperature of at least one power semiconductor device of the at least one current conversion device;
  determining whether an amount of the at least one renewable energy power source is above a predetermined threshold; and,
  increasing or maintaining the temperature of the at least one power semiconductor device during periods of time when the amount of the at least one renewable energy power source is below the predetermined threshold.

Clause 2. The method of claim 1, wherein the at least one current conversion device comprises at least one of a power converter or a power inverter.

Clause 3. The method of any of the preceding clauses, wherein the renewable energy power system comprises at least one of a wind turbine power system, a solar power system, or an energy storage power system, the at least one renewable energy power source comprising at least one of wind, sun, or stored energy.

Clause 4. The method of any of the preceding clauses, wherein increasing or maintaining the temperature of the at least one power semiconductor device during periods of time when the amount of the at least one renewable energy power source is below the predetermined threshold further comprises:
  increasing a coolant temperature of the at least one power semiconductor device to an increased coolant temperature.

Clause 5. The method of Clause 4, wherein increasing the coolant temperature of the at least one power semiconductor device to the increased coolant temperature further comprises:
  thermostatically controlling the coolant temperature via a mechanical thermostat system.

Clause 6. The method of Clause 4, wherein increasing the coolant temperature of the at least one power semiconductor device to the increased coolant temperature further comprises:
  electrically adjusting a fan speed of a cooling fan of the at least one power semiconductor device.

Clause 7. The method of Clause 4, wherein the at least one power semiconductor device comprises at least one of an insulated-gate bipolar transistor (IGBT), an integrated gate commutated thyristor (IGCT), a gate commutated thyristor (GCT), a diode, or a metal oxide semiconductor field effect transistor (MOSFET).

Clause 8. The method of Clause 1, further comprising reducing or stopping switching of the at least one power semiconductor device as the temperature of the at least one power semiconductor device increases.

Clause 9. The method of any of the preceding clauses, wherein increasing or maintaining the temperature of the at least one power semiconductor device during periods of time when the amount of the at least one renewable energy power source is below the predetermined threshold further comprises:
  operating the at least one power semiconductor device at a minimal current such that only switching power loss provides heat to the at least one power semiconductor device.

Clause 10. The method of Clause 9, wherein increasing or maintaining the temperature of the at least one power semiconductor device during periods of time when the amount of the at least one renewable energy power source is below the predetermined threshold further comprises:
  increasing a switching frequency of the at least one power semiconductor device to increase the switching power loss.

Clause 11. The method of any of the preceding clauses, wherein increasing or maintaining the temperature of the at least one power semiconductor device during periods of time when the amount of the at least one renewable energy power source is below the predetermined threshold further comprises:
  circulating reactive power through a line filter of the at least one current conversion device so as to maintain switching of the at least one power semiconductor device.

Clause 12. A renewable energy power system driven by at least one renewable energy power source, the renewable energy power system comprising:
  at least one current conversion device comprising at least one power semiconductor device;
  one or more sensors for determining a temperature of the at least one power semiconductor device; and,
  a controller communicatively coupled to the one or more sensors, the controller configured for performing a plurality of operations, the plurality of operations comprising:
    determining whether the at least one renewable energy power source is above a predetermined threshold; and,
    increasing or maintaining the temperature of the at least one power semiconductor device during periods of time when the amount of the at least one renewable energy power source is below the predetermined threshold.

Clause 13. The renewable energy power system of Clause 12, wherein the at least one current conversion device comprises at least one of a power converter or a power inverter.

Clause 14. The renewable energy power system of Clauses 12 or 13, wherein the renewable energy power system comprises at least one of a wind turbine power system, a solar power system, or an energy storage power system, the at least one renewable energy power source comprising at least one of wind, sun, or stored energy.

Clause 15. The renewable energy power system of Clauses 12, 13, or 14, wherein increasing or maintaining the temperature of the at least one power semiconductor device during periods of time when the amount of the at least one renewable energy power source is below the predetermined threshold further comprises:
  increasing a coolant temperature of the at least one power semiconductor device to an increased coolant temperature.

Clause 16. The renewable energy power system of Clause 15, wherein increasing the coolant temperature of the at least one power semiconductor device to the increased coolant temperature further comprises at least one of thermostatically controlling the coolant temperature via a mechanical thermostat system or electrically adjusting a fan speed of a cooling fan of the at least one power semiconductor device.

Clause 17. The renewable energy power system of Clauses 12, 13, 14, 15, or 16, wherein the at least one power semiconductor device comprises at least one of an insulated-gate bipolar transistor (IGBT), an integrated gate commutated thyristor (IGCT), a gate commutated thyristor (GCT), a diode, or a metal oxide semiconductor field effect transistor (MOSFET).

Clause 18. The renewable energy power system of Clauses 12, 13, 14, 15, 16, or 17, further comprising reducing or stopping switching of the at least one power semiconductor device as the temperature of the at least one power semiconductor device increases.

Clause 19. The renewable energy power system of Clauses 12, 13, 14, 15, 16, 17, or 18, wherein increasing or maintaining the temperature of the at least one power semiconductor device during periods of time when the amount of the at least one renewable energy power source is below the predetermined threshold further comprises:
  operating the at least one power semiconductor device at a minimal current such that only switching power loss provides heat to the at least one power semiconductor device.

Clause 20. The renewable energy power system of Clauses 12, 13, 14, 15, 16, 17, 18, or 19, wherein increasing or maintaining the temperature of the at least one power semiconductor device during periods of time when the amount of the at least one renewable energy power source is below the predetermined threshold further comprises:
  circulating reactive power through a line filter of the at least one current conversion device so as to maintain switching of the at least one power semiconductor device.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A method for operating a renewable energy power system driven by at least one renewable energy power source, the renewable energy power system having at least one current conversion device, the method comprising:
  determining a temperature of at least one power semiconductor device of the at least one current conversion device;
  determining whether an amount of power of the at least one renewable energy power source is above a predetermined threshold; and,
  increasing or maintaining the temperature of the at least one power semiconductor device during periods of time when the amount of power of the at least one renewable energy power source is below the predetermined threshold.

2. The method of claim 1, wherein the at least one current conversion device comprises at least one of a power converter or a power inverter.

3. The method of claim 1, wherein the renewable energy power system comprises at least one of a wind turbine power system, a solar power system, or an energy storage power system, the at least one renewable energy power source comprising at least one of wind, sun, or stored energy.

4. The method of claim 1, wherein increasing or maintaining the temperature of the at least one power semiconductor device during periods of time when the amount of power of the at least one renewable energy power source is below the predetermined threshold further comprises:
increasing a coolant temperature of the at least one power semiconductor device to an increased coolant temperature.

5. The method of claim 4, wherein increasing the coolant temperature of the at least one power semiconductor device to the increased coolant temperature further comprises:
thermostatically controlling the coolant temperature via a mechanical thermostat system.

6. The method of claim 4, wherein increasing the coolant temperature of the at least one power semiconductor device to the increased coolant temperature further comprises:
electrically adjusting a fan speed of a cooling fan of the at least one power semiconductor device.

7. The method of claim 4, wherein the at least one power semiconductor device comprises at least one of an insulated-gate bipolar transistor (IGBT), an integrated gate commutated thyristor (IGCT), a gate commutated thyristor (GCT), a diode, or a metal oxide semiconductor field effect transistor (MOSFET).

8. The method of claim 1, further comprising reducing or stopping switching of the at least one power semiconductor device as the temperature of the at least one power semiconductor device increases.

9. The method of claim 1, wherein increasing or maintaining the temperature of the at least one power semiconductor device during periods of time when the amount of power of the at least one renewable energy power source is below the predetermined threshold further comprises:
operating the at least one power semiconductor device at a minimal current such that only switching power loss provides heat to the at least one power semiconductor device.

10. The method of claim 9, wherein increasing or maintaining the temperature of the at least one power semiconductor device during periods of time when the amount of power of the at least one renewable energy power source is below the predetermined threshold further comprises:
increasing a switching frequency of the at least one power semiconductor device to increase the switching power loss.

11. The method of claim 1, wherein increasing or maintaining the temperature of the at least one power semiconductor device during periods of time when the amount of power of the at least one renewable energy power source is below the predetermined threshold further comprises:
circulating reactive power through a line filter of the at least one current conversion device so as to maintain switching of the at least one power semiconductor device.

12. A renewable energy power system driven by at least one renewable energy power source, the renewable energy power system comprising:
at least one current conversion device comprising at least one power semiconductor device;
one or more sensors for determining a temperature of the at least one power semiconductor device; and,
a controller communicatively coupled to the one or more sensors, the controller configured for performing a plurality of operations, the plurality of operations comprising:
determining whether an amount of power of the at least one renewable energy power source is above a predetermined threshold; and,
increasing or maintaining the temperature of the at least one power semiconductor device during periods of time when the amount of the at least one renewable energy power source is below the predetermined threshold.

13. The renewable energy power system of claim 12, wherein the at least one current conversion device comprises at least one of a power converter or a power inverter.

14. The renewable energy power system of claim 12, wherein the renewable energy power system comprises at least one of a wind turbine power system, a solar power system, or an energy storage power system, the at least one renewable energy power source comprising at least one of wind, sun, or stored energy.

15. The renewable energy power system of claim 12, wherein increasing or maintaining the temperature of the at least one power semiconductor device during periods of time when the amount of power of the at least one renewable energy power source is below the predetermined threshold further comprises:
increasing a coolant temperature of the at least one power semiconductor device to an increased coolant temperature.

16. The renewable energy power system of claim 15, wherein increasing the coolant temperature of the at least one power semiconductor device to the increased coolant temperature further comprises at least one of thermostatically controlling the coolant temperature via a mechanical thermostat system or electrically adjusting a fan speed of a cooling fan of the at least one power semiconductor device.

17. The renewable energy power system of claim 12, wherein the at least one power semiconductor device comprises at least one of an insulated-gate bipolar transistor (IGBT), an integrated gate commutated thyristor (IGCT), a gate commutated thyristor (GCT), diodes, or a metal oxide semiconductor field effect transistor (MOSFET).

18. The renewable energy power system of claim 17, further comprising reducing or stopping switching of the at least one power semiconductor device as the temperature of the at least one power semiconductor device increases.

19. The renewable energy power system of claim 12, wherein increasing or maintaining the temperature of the at least one power semiconductor device during periods of time when the amount of power of the at least one renewable energy power source is below the predetermined threshold further comprises:
operating the at least one power semiconductor device at a minimal current such that only switching power loss provides heat to the at least one power semiconductor device.

20. The renewable energy power system of claim 12, wherein increasing or maintaining the temperature of the at least one power semiconductor device during periods of time when the amount of power of the at least one renewable energy power source is below the predetermined threshold further comprises:

circulating reactive power through a line filter of the at least one current conversion device so as to maintain switching of the at least one power semiconductor device.

* * * * *